`US006783921B2`

United States Patent
Kaimori et al.

(10) Patent No.: US 6,783,921 B2
(45) Date of Patent: Aug. 31, 2004

(54) METHOD FOR ETCHING LAMINATED ASSEMBLY INCLUDING POLYIMIDE LAYER

(75) Inventors: Shingo Kaimori, Osaka (JP); Tsuyoshi Nonaka, Osaka (JP); Satoshi Koshimuta, Kagoshima (JP); Masato Tsurugasaki, Kagoshima (JP)

(73) Assignees: Sumitomo Electric Industries, Ltd., Osaka (JP); Fuchigami Micro Co., Ltd., Kagoshima (JP)

( * ) Notice: Subject to any disclaimer, the term of this patent is extended or adjusted under 35 U.S.C. 154(b) by 23 days.

(21) Appl. No.: 10/059,107

(22) Filed: Jan. 31, 2002

(65) Prior Publication Data
US 2003/0054293 A1 Mar. 20, 2003

(30) Foreign Application Priority Data

Jun. 28, 2001 (JP) .......................... 2001-197029
Oct. 29, 2001 (JP) .......................... 2001-331280

(51) Int. Cl.$^7$ .................... G03C 1/76; B32B 27/00; B32B 7/00
(52) U.S. Cl. .................. 430/326; 430/322; 430/330; 430/273.1; 430/277.1; 428/209; 428/473.5; 428/458; 216/47; 216/49
(58) Field of Search ................ 430/326, 322, 430/330, 273.1, 277.1; 428/209, 473.5, 458; 216/47–49

(56) References Cited

U.S. PATENT DOCUMENTS

| 4,276,186 | A | | 6/1981 | Bakos et al. ............ 134/38 |
| 5,374,469 | A | * | 12/1994 | Hino et al. ............ 428/209 |
| 6,218,022 | B1 | | 4/2001 | Suzuki et al. ............ 428/457 |
| 6,403,211 | B1 | * | 6/2002 | Yang et al. ............ 428/308.4 |
| 2003/0052078 | A1 | | 3/2003 | Sakayori et al. ............ 216/13 |
| 2003/0085451 | A1 | | 5/2003 | Sakayori et al. ............ 257/642 |

FOREIGN PATENT DOCUMENTS

| JP | 56-5899 | 1/1981 |
| JP | 4-015233 | 1/1992 |
| JP | 4-020541 | 1/1992 |
| JP | 5-202206 | 8/1993 |
| JP | 5-283486 | 10/1993 |
| JP | 5-301981 | 11/1993 |
| JP | 6-234870 | 8/1994 |
| JP | 10-97081 | 4/1998 |
| JP | 10-195214 | 7/1998 |

* cited by examiner

*Primary Examiner*—Mark F. Huff
*Assistant Examiner*—Daborah Chacko-Davis
(74) *Attorney, Agent, or Firm*—Smith, Gambrell & Russell, LLP

(57) ABSTRACT

Disclosed is an etching method of a laminated assembly having a metal layer and a non-thermoplastic polyimide layer bonded together via thermoplastic polyimide, which comprises using an etchant at least containing an alkali metal hydroxide, water and oxyalkylamine, wherein the concentrations of the alkali metal hydroxide (X weight %) and of the water (Y weight %) have relationships represented by coordinate points present within a region (inclusive of boundary lines) defined by the following expressions [1] and [2]:

$Y=(\frac{1}{2})X$ (provided that $7 \leq X \leq 45$)  [1]

$Y=(\frac{5}{20})X+17.5$ (provided that $7 \leq X \leq 45$)  [2]

provided that X and Y are defined based on the total weight of the alkali metal hydroxide, water and oxyalkylamine expressed as 100.

7 Claims, 2 Drawing Sheets

METHOD FOR ETCHING LAMINATED ASSEMBLY INCLUDING POLYIMIDE LAYER

This application is based on applications Nos. 2001-197029 and 2001-331280 filed in Japan, the contents of which are incorporated hereinto by reference.

BACKGROUND OF THE INVENTION

The present invention relates to an etching method for wet etching a laminated assembly having a polyimide layer.

Multilayer structures have found a great variety of applications, the structure comprising laminations of an insulative resin film and a metal layer imparting rigidity and defining a conductive circuit. Of the resin materials for forming the film, polyimide resins are widely used because of their superior heat resistance, dimensional stability, resistance to agents, electrical properties and mechanical properties. For instance, the polyimide resin is used in flexible printed circuits, film carriers employed for TAB (Tape Automated Bonding) or COF (Chip on film) mounting, and flexures with wiring for use in magnetic head suspensions and the like.

A method for fabricating the laminated assembly comprising the non-thermoplastic polyimide film and the metal layer includes (a) one wherein a metallic circuit layer is formed on the aforesaid resin film by spattering, electrolytic plating or the like; (b) one wherein a liquid-like non-thermoplastic polyimide (or polyamic acid as the precursor thereof) is applied to the metal layer by coating or casting; and (c) one wherein laminations of the resin film and the metal foil bonded together via an adhesive layer is processed.

The above methods each have an advantage and disadvantage and are selectively adopted according to applications. The method (a) has advantages of enjoying a great number of applicable non-thermoplastic polyimides and accomplishing an excellent fine patterning characteristic in circuit formation but suffers a disadvantage of low adhesion between the non-thermoplastic polyimide layer and the metal layer. The method (b) assures a good adhesion between the non-thermoplastic polyimide layer and the metal layer but limits the applicable non-thermoplastic polyimide to those having low thermal expansibilities (expansibilities close to that of the metal). On the other hand, the method (c) has advantages of good adhesion between the non-thermoplastic polyimide layer and the metal layer and a relatively large number of applicable non-thermoplastic polyimides. However, the method uses an adhesive material having lower heat resistance and electrical properties than the non-thermoplastic polyimide, so that the resultant products suffer poor characteristics as well as low resistance to agents and heat.

Conventionally, an epoxy-based or acrylic adhesive is widely used for forming the adhesive layer which is essential in the method (c). More recently, however, the use of an adhesive layer of thermoplastic polyimide is increasing as an approach to enhance the above advantages and to improve the poor characteristics attributable to the adhesive layer.

In the laminated assembly comprising the non-thermoplastic polyimide layer and metal layer, the formation of hole in the polyimide layer is generally done by laser processing, plasma processing (dry etching), wet etching or the like. Among these, the plasma processing provides a smoothly etched surface, as shown in FIG. 4. However, this method requires a special equipment and hence, is not so suitable for general purpose use in terms of economy. Because of the isotropic nature, the wet etching process has a drawback of etching away a portion under the metal mask layer (see FIG. 1). However, this method is widely used because the polyimide layer can be etched quickly and economically. Hence, there have been proposed a great variety of etching solutions comprising an alkali metal hydroxide, alcohol, phenol, amine compound, amide compound, oxyalkylamine, hydrazine or the like (see, for example, Japanese Unexamined Patent Publication No. 10(1998)-97081).

Unfortunately, where the conventional etching solution is applied to the laminated assembly including the non-thermoplastic polyimide layer and the metal layer bonded together via the adhesive layer of thermoplastic polyimide, a favorably etched feature cannot be obtained because the thermoplastic polyimide is etched at much lower etching rate than the non-thermoplastic polyimide so that great pits and projections are produced on a side of an etched portion, as shown in FIG. 3. It is noted that the figure shows, in vertical section, one typical side of an etched laminated assembly, wherein P1 indicates the non-thermoplastic polyimide layer; P2 indicates the adhesive layer of thermoplastic polyimide; and K indicates the metal layer.

As to the etching of the polyimide layer, an attempt has been made to simplify the complicated etching process by employing a dry-film resist layer as a resist mask instead of a metal mask. The metal mask means a resist mask for polyimide etching, which is produced by etching the metal layer or by depositing a metal layer on the laminated assembly by sputtering or the like to form a mask thereon. Where the metal mask is produced by etching the metal layer, the polyimide etching process includes the steps of producing the metal mask and then etching the polyimide layer, the metal mask produced by exposing a resist to light, developing the resist, etching a metal layer and removing the resist.

If, on the other hand, the dry film resist can be used in the polyimide etching process, the process is simplified because the steps of exposing and developing the resist are followed by etching the polyimide layer. Unfortunately, if the dry-film resist is formed according to the conventional conditions, there is a drawback that the adhesion between the dry film and the polyimide layer is decreased during the etching process, resulting in the separation of the dry film from the polyimide layer.

In view of the foregoing, it is an object of the present invention to provide a wet etching method which accomplishes a smoothly etched feature of the laminated assembly comprising the non-thermoplastic polyimide layer and the metal layer bonded together via the adhesive of thermoplastic polyimide without producing difference between an etching amount of the thermoplastic polyimide portion and that of the non-thermoplastic polyimide portion, and which assures an etching process free from inter-layer delamination despite the application of the dry-film resist layer to the process.

SUMMARY OF THE INVENTION

The present inventors have made intensive study to achieve the above object, focusing on the compositions of the etching solution to find that the following etchant permits the etching process to proceed without producing difference between an etching amount of the thermoplastic polyimide portion and that of the non-thermoplastic polyimide portion. That is, the etchant contains an alkali metal hydroxide, oxyalkylamine and water and is prepared in a particular manner that the concentrations of the alkali metal hydroxide and water satisfy specific relationships. The inventors have made further investigation based on the finding thereby to achieve the present invention.

According to the invention, a method for etching a laminated assembly is characterized in that a laminated assembly comprising a metal layer and a non-thermoplastic polyimide layer bonded together via thermoplastic polyimide is etched using an etchant at least containing an alkali metal hydroxide, water and oxyalkylamine, the concentrations of the alkali metal hydroxide (X weight %) and of the water (Y weight %) having relationships represented by coordinate points present within a region (inclusive of boundary lines) defined by the following expressions [1] and [2]:

$$Y=(\tfrac{1}{2})X \text{ (provided that } 7 \leq X \leq 45) \quad [1]$$

$$Y=(\tfrac{9}{20})X+17.5 \text{ (provided that } 7 \leq X \leq 45) \quad [2]$$

provided that X and Y are defined based on the total weight of the alkali metal hydroxide, water and oxyalkylamine expressed as 100.

FIG. 5 is a graph representing the above relationships of the concentrations of the components. In the figure, ● represents each of Examples 1–9 plotted between the concentrations of potassium hydroxide and water, whereas X represents each of Comparative Examples 1–4 plotted the same way. That is, the concentrations of the alkali metal hydroxide and water in the etchant according to the invention are represented by coordinate points present within a crosshatched region (inclusive of boundary lines) in the chart. Besides the above two components, the etchant contains oxyalkylamine as a principal component. However, the etchant may further contain a suitable small amount of additive as required. The use of the etchant featuring the concentrations of the components so related permits the etching of the laminated assembly to proceed without difference between the etching rates at these polyimide layers, thus providing a smoothly etched feature in short time.

If the concentrations of water are under the line of the expression [1], the water is insufficient in amount for dissolving the alkali metal hydroxide and oxyalkylamine. Furthermore, such an etchant presents a low etching rate and hence, is not preferred. Conversely if the concentrations of water are above the line of the expression [2], such an etchant provides an excessive etching residue and hence, is not preferred. On the other hand, if the alkali metal hydroxide is present in concentrations of less than 7 weight %, such an etchant presents a low etching rate and hence, is not preferable. If the concentrations of the alkali metal hydroxide exceed 45 weight %, the region defined by the lines of the expressions [1] and [2] is so narrow that the preparation of the etchant is difficult. In addition, such an etchant is susceptible to variations of the compositions thereof while used (because of the evaporation of the liquid during the etching process). Therefore, the etchant is not preferred.

According to the present invention, potassium hydroxide may preferably be used as the alkali metal hydroxide whereas ethanolamine may preferably be used as the oxyalkylamine.

Preferred as the non-thermoplastic polyimide is polypyromellitimide polyimide. Particularly preferred as the metal layer are a copper thin film and stainless steel layer.

Where the inventive method is applied to a process where the polyimide layer of the laminated assembly is covered with a dry-film resist layer as an etching mask, there occurs no inter-layer delamination. Therefore, the inventive method provides a remarkable contribution to the reduction of steps in contrast to a process where the metal mask is used.

It is preferred that the dry-film resist layer is exposed to ultraviolet rays in an amount of 10 to 13 steps as measured with Stouffer 21-step tablets available from Stouffer Graphic Arts Equipment Co., and then developed. This ensures that the adhesion between the resist layer and the polyimide layer is increased.

It is preferred that the dry-film resist layer is further subjected to post-baking and/or re-exposure to light. This is also effective to increase the adhesion between the resist layer and the polyimide layer. It is preferred that the resist layer is re-exposed to twice as much ultraviolet rays as in the previous light exposure step.

Figure 1:
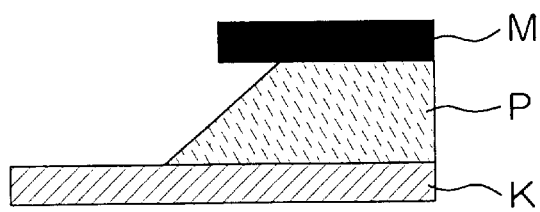
FIG. 1 shows a feature of a wet etched surface of a laminated assembly having a masked polyimide layer.

The symbols in the figures represent the followings: M: mask layer, P: polyimide layer, K: metal layer, DF: dry-film resist layer, P1: non-thermoplastic polyimide layer, P2: thermoplastic polyimide layer (adhesive layer), Cu: copper thin film, ER: etching residue.

DETAILED DESCRIPTION OF THE INVENTION

A preferred embodiment of the invention will be described in detail herein below.

Although the alkali metal hydroxide is preferably exemplified by potassium hydroxide, other examples thereof include sodium hydroxide, lithium hydroxide and the like.

The aforesaid oxyalkylamine (or amino alcohol) may preferably have 2 to 8 carbon atoms and may include monoalkyl or dialkyl. Although a particularly preferred oxyalkylamine is ethanolamine, other examples thereof include propanolamine, butanolamine, N(β-aminoethyl) ethanolamine, diethanolamine, dipropanolamine, N-methylethanolamine, N-ethylethanolamine and the like.

The thermoplastic polyimide means a polyimide which is softened by heating thereby to present bonding properties. Marketed products may be used as such a polyimide, including, for example, "AURUM (Regulus)" available from Mitsui Chemicals, Inc., "Pixio" available from Kaneka Corporation, and the like. Other usable polyimides include those comprising repeating units represented by the following formulas (1) to (9) or like repeating units:

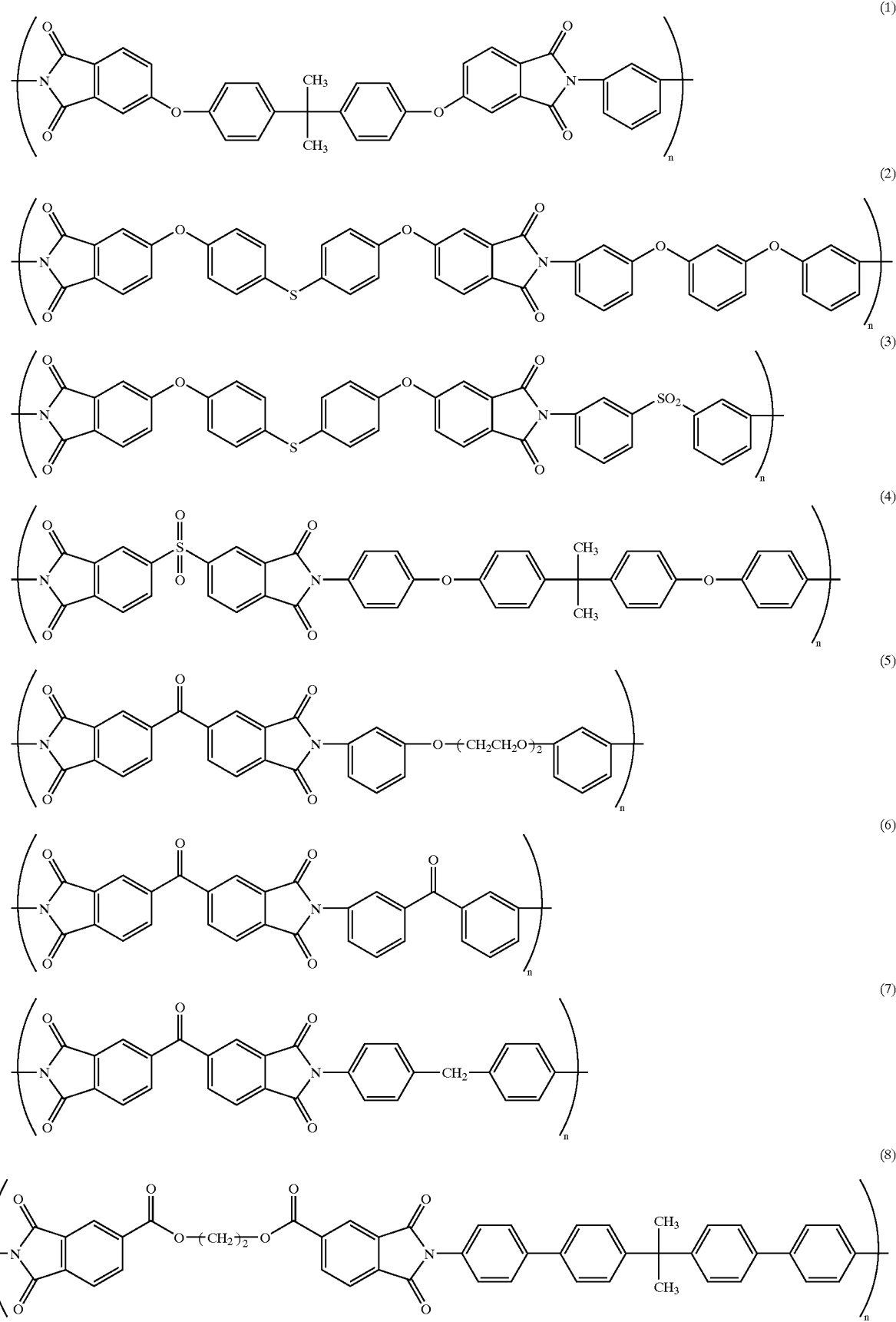

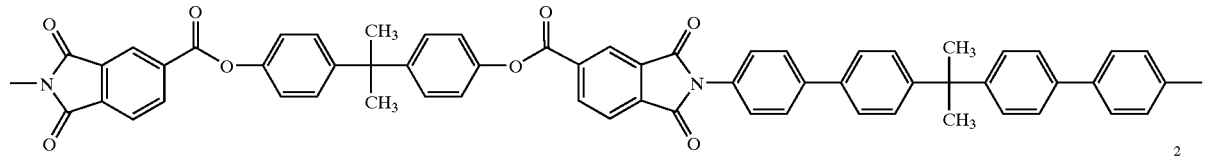

In contrast to the aforesaid thermoplastic polyimide, the non-thermoplastic polyimide means one which is not softened nor presents bonding properties when heated. The non-thermoplastic polyimide is generally used as an electrical insulating material or a forming material for fabrication of flexure or the like. Among others, particularly preferred is polypyromellitimide polyimide which is a product of reaction between pyromellitic anhydride and aromatic diamine and has a repeating unit represented by the following formula (10):

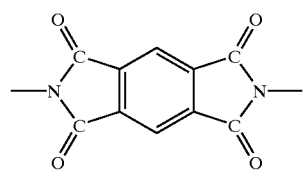

Marketed products may be used as such a polyimide, including, for example, "Kapton" available from Du Pont Co., "Apical" available from Kaneka Corporation, and the like.

Another usable non-thermoplastic polyimide is polybiphenyl tetracarboxylimide produced from biphenyl tetracarboxylic dianhydride and diamine, which is not so preferable because it is etched at low rates.

Examples of a material for the metal layer include copper, gold, aluminum and the like which may be used for forming a layer defining an electrical circuit, or stainless steel, iron, molybdenum, nickel and the like which may be used for forming a layer contributing the rigidity of the assembly. However, the present invention is not particularly limited to the above metals. It is noted, however, that FPCs and carrier tapes preferably employ copper in the light of flexibility and electrical properties whereas flexures often employ a combination of copper and stainless steel.

In accordance with the present invention, the laminated assembly to be etched comprises the metal layer and non-thermoplastic polyimide layer bonded together via thermoplastic polyimide. The assembly may be fabricated by the known method such as hot press, roll press, lamination or the like.

Next, an etching process according to the present invention will be described.

The etching process is performed for the purposes of forming through-holes, openings for resonance or weight reduction, or patterns at desired places of the laminated assembly.

A preferable temperature of an etchant varies depending upon polyimides to which the etchant is applied but is generally selected from the range of 50 to 90° C.

The etching process may employ suitable means for exposing the laminated assembly to the etchant. For instance, the etchant may be applied by immersion method or immersion/rocking method. Alternatively, the etchant may be applied to a desired place by spraying through nozzle. Furthermore, the etchant may be ultrasonically applied.

The etching process of the invention is particularly suitable for etching polyimide covered with a dry-film resist as a mask. In this process, favorable etching characteristics may be obtained by increasing the amount of light radiation for development by far from that of the normal process. More specifically, the dry film resist may preferably be exposed to ultraviolet rays in an amount of 10 to 13 steps as measured with Stouffer 21-step tablets available from Stouffer Graphic Arts Equipment Co. The step of irradiated light was determined subsequent to 2-minute development process using 1% sodium carbonate aqueous solution at 30° C.

The light exposure may be performed by the normal method. After the light exposure, a non-exposed area of the resist may be removed from a developed area thereof by the normal method.

In addition to the increase of the amount of light radiation, the following steps may be taken to avoid the decreased adhesion, thereby providing a favorable etching process: (1) a re-heating step (post-baking) between the development step and the etching step; and/or (2) a re-exposure step between the development step and the etching step.

If the laminated assembly comprising the non-thermoplastic polyimide layer and the thermoplastic polyimide layer is wet etched according to the method of the present invention as described above, the etching proceeds without difference between the etching rates at these polyimide layers, resulting in an evenly and smoothly etched feature. Furthermore, the present invention provides a simplified etching process using the dry-film resist layer as the resist mask wherein the adhesion between the dry film and the polyimide layer is enhanced. Hence, the inventive method offers a favorably etched feature of the laminated assembly at high working efficiency without causing the inter-layer delamination which has been encountered by the conventional methods.

EXAMPLES

The present invention will be described in more details with reference to examples and comparative examples thereof.

Examples 1–9 and Comparative Examples 1–4

Figure 2:
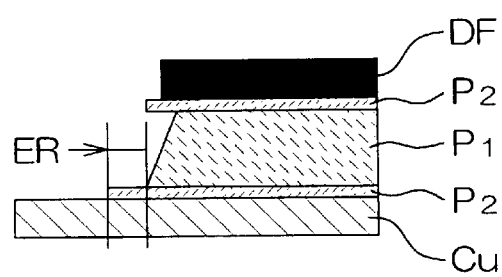
FIG. 2 shows a configuration and an etching residue of a laminated assembly including a polyimide layer to be etched.
Figure 3:
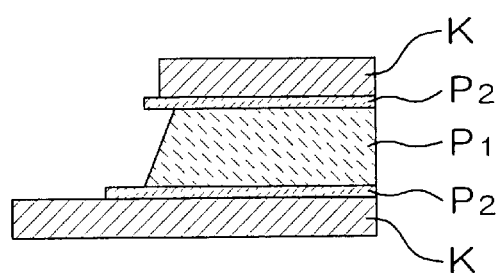
FIG. 3 is shows a feature of a wet etched surface of a laminated assembly including a thermoplastic polyimide layer and a non-thermoplastic polyimide layer, the wet etching being done by the conventional method.
Figure 4:
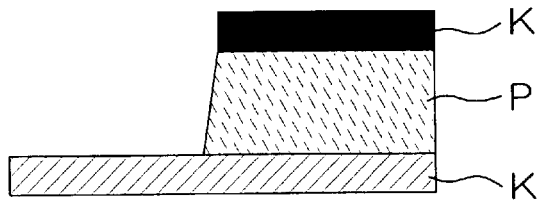
FIG. 4 shows a feature of a plasma etched surface.

A multilayer structure sandwiching Du Pont's Kapton sheet of non-thermoplastic polyimide (thickness of 13 μm) between two copper foil sheets (thickness of 18 μm) was fabricated by bonding the sheets with a thermoplastic polyimide resin (thickness of 1.5 μm). Subsequently, the copper foil portion was etched with a ferric chloride solution to produce a circuit. Thus was obtained a laminated assembly of FIG. 2 having a dry film (thickness of 50 μm) laid over an area where the polyimide was exposed by etching away the copper foil on one side. The resultant laminated assembly was subjected to light exposure, development, post-baking and re-exposure to light so as to form a circular opening having a diameter of 600 μm in the dry film. The amount of light radiation was set to 12 step as determined using the 21-step tablets available from Stouffer Graphic Arts Equipment Co. The development step was performed for 2 minutes using 1% sodium carbonate at 30° C. The laminated assembly was post baked at 200° C. for 20 minutes and re-exposed to twice as much light as in the previous light exposure step.

Then the laminated assembly was immersed in each of the etchants containing potassium hydroxide, water and ethanolamine in concentrations listed in Table 1, thereby to etch the non-thermoplastic polyimide layer and the thermoplastic polyimide. Each of the etchants was determined for etching time to an end point when a circular copper foil surface 570 μm in diameter was exposed. Furthermore, measurement was taken on the length of an etching residue of the non-thermoplastic polyimide (represented by 'ER' in FIG. 2) relative to the thermoplastic polyimide. The results are listed in Table 1.

In the comprehensive evaluation of the etchants, an etchant presenting an etching time of not less than 10 minutes or an etching residue of not less than 5 μm is represented by (X) whereas an etchant achieving an etching time of less than 10 minutes and an etching residue of less than 5 μm is represented by (○).

The results demonstrates that the etchant, which contains therein potassium hydroxide, water and ethanolamine in concentrations within the ranges specified by the invention, can provide a practically advantageous wet etching process.

What is claimed is:

1. A method for etching a laminated assembly including a polyimide layer, which comprises etching a laminated assembly comprising a metal layer and a non-thermoplastic polyimide layer bonded together via thermoplastic polyimide with an etchant at least containing an alkali metal hydroxide, water and oxyalkylamine, wherein the concentrations of the alkali metal hydroxide (X weight %) and of the water (Y weight %) have relationships represented by coordinate points present within a region (inclusive of boundary lines) defined by the following expressions [1] and [2]:

$Y = (1/2)X$ (provided that $7 \leq X \leq 45$) [1]

$Y = (5/20)X + 17.5$ (provided that $7 \leq X \leq 45$) [2]

provided that X and Y are defined based on the total weight of the alkali metal hydroxide, water and oxyalkylamine expressed as 100.

2. The etching method according to claim 1, wherein the etchant contains potassium hydroxide as the alkali metal hydroxide and ethanolamine as the oxyalkylamine.

3. The etching method according to claim 1, wherein the non-thermoplastic polyimide is polypyromellitimide polyimide.

TABLE 1

| | Ex. 1 | Ex. 2 | Ex. 3 | Ex. 4 | Ex. 5 | Ex. 6 | Ex. 7 | Ex. 8 | Ex. 9 | C Ex. 1 | C Ex. 2 | C Ex. 3 | C Ex. 4 |
|---|---|---|---|---|---|---|---|---|---|---|---|---|---|
| Thermoplastic polyimide (Etchant) | Regulus | Regulus | Regulus | Regulus | Regulus | Regulus | Regulus | Regulus | Pixio | Regulus | Regulus | Regulus | Regulus |
| Potassium hydroxide (%) | 10 | 15 | 15 | 15 | 20 | 30 | 35 | 35 | 20 | 5 | 15 | 25 | 35 |
| Water (%) | 10 | 10 | 15 | 20 | 20 | 25 | 20 | 25 | 20 | 5 | 25 | 25 | 30 |
| Ethanolamine (%) | 80 | 75 | 70 | 65 | 60 | 45 | 45 | 40 | 60 | 90 | 60 | 50 | 35 |
| Etching time (min) | 9 | 9 | 7 | 5 | 5 | 4 | 6 | 4 | 5 | 15 | 3 | 4 | 3 |
| Etching residue (μm) | 1 | 2 | 2 | 4 | 4 | 5 | 3 | 4 | 4 | 1 | 8 | 6 | 7 |
| Comprehensive evaluation | ○ | ○ | ○ | ○ | ○ | ○ | ○ | ○ | ○ | X | X | X | X |

Figure 5:
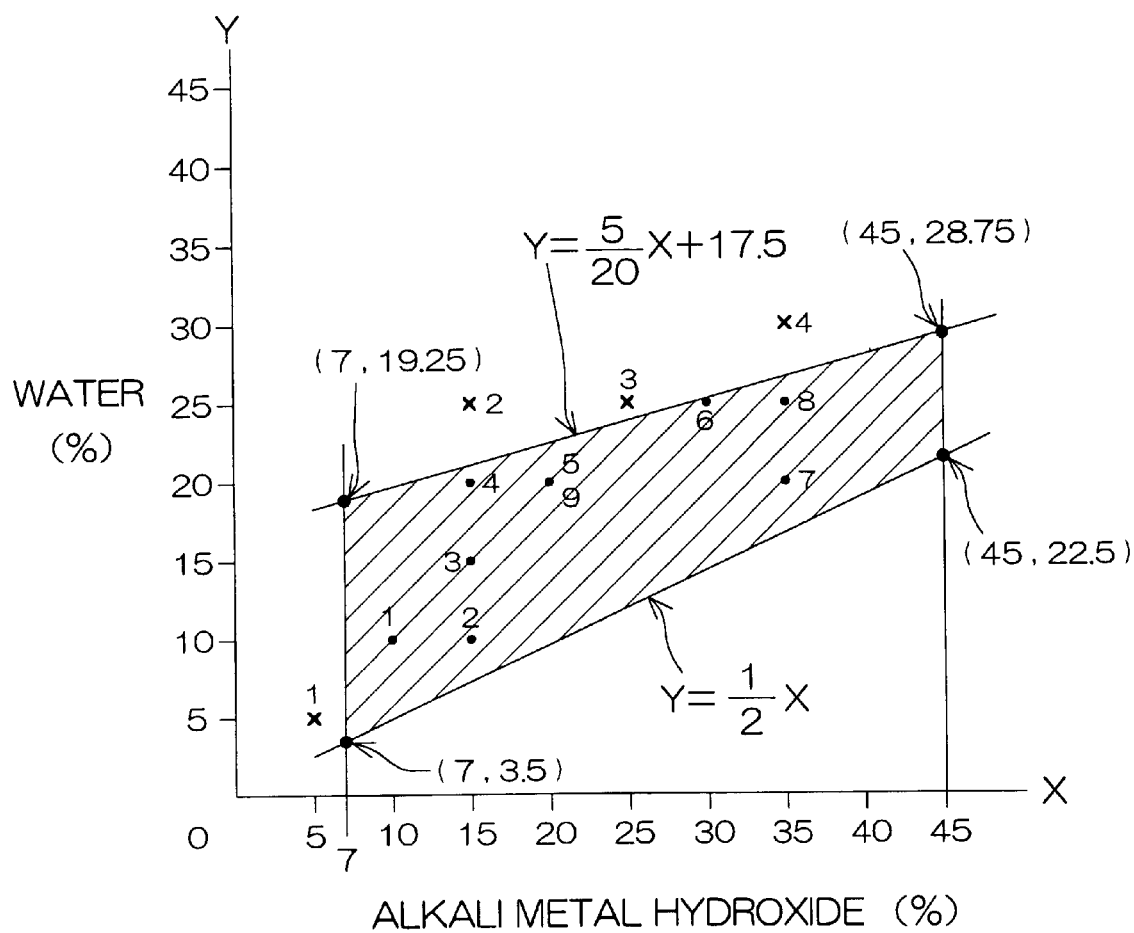
FIG. 5 is a graph representing the relationships between the concentrations of water and alkali metal hydroxide contained in an etchant according to the present invention.

As shown in Table 1, Examples 1–9 (each represented in FIG. 5 by ● plotted between the concentrations of potassium hydroxide and water) each etched the non-thermoplastic polyimide to a desired etching residue in short time, accomplishing a smoothly etched feature with no step formed between the non-thermoplastic polyimide layer and the thermoplastic polyimide layer. In contrast, Comparative Example 1 was not practicable because it required too long an etching time. Comparative Examples 2–4 resulted in excessive etching residues, failing to provide smoothly etched features. It is noted that Comparative Examples 1–4 are each represented in FIG. 5 by X plotted between the concentrations of potassium hydroxide and water.

4. The etching method according to any one of claims 1 to 3, wherein the metal layer comprises a copper thin film and/or a stainless steel layer.

5. The etching method according to any one of claims 1 to 3, wherein the polyimide layer of the laminated assembly is covered with a dry-film resist layer as an etching mask.

6. The etching method according to claim 5, wherein the dry-film resist layer is exposed to ultraviolet rays in an amount of 10 to 13 steps, and then developed.

7. The etching method according to claim 6, wherein the dry-film resist layer is further subjected to post-baking and/or re-exposure to light.

* * * * *